United States Patent [19]

Murase et al.

[11] Patent Number: 4,460,417
[45] Date of Patent: Jul. 17, 1984

[54] METHOD OF MANUFACTURING INSULATING FILM AND ELECTRIC DEVICE UTILIZING THE SAME

[75] Inventors: Katsumi Murase, Iruma; Teruo Tamama, Houya; Yoshihito Amemiya; Yoshihiko Mizushima, both of Fuchu, all of Japan

[73] Assignee: Nippon Telegraph & Telephone Public Corporation, Japan

[21] Appl. No.: 436,035

[22] Filed: Oct. 22, 1982

[30] Foreign Application Priority Data

Oct. 27, 1981 [JP] Japan .................................. 56-171554

[51] Int. Cl.³ .................... H01L 21/225; H01L 21/265
[52] U.S. Cl. ........................................ 148/187; 148/1.5; 148/188; 148/190; 427/93
[58] Field of Search ................ 148/187, 188, 190, 1.5; 427/93

[56] References Cited

U.S. PATENT DOCUMENTS

| | | | |
|---|---|---|---|
| 3,928,095 | 12/1975 | Harigaya et al. | 148/190 X |
| 4,069,067 | 1/1978 | Ichinohe | 148/187 X |
| 4,074,304 | 2/1978 | Shiba | 148/175 X |
| 4,169,740 | 10/1979 | Kalbitzer et al. | 148/1.5 |
| 4,339,285 | 7/1982 | Pankove | 148/1.5 |
| 4,357,179 | 11/1982 | Adams et al. | 148/1.5 |

*Primary Examiner*—G. Ozaki
*Attorney, Agent, or Firm*—Blakely, Sokoloff, Taylor & Zafman

[57] ABSTRACT

An insulating film is prepared by oxidizing an amorphous silicon layer containing boron or boron and germanium. The amorphous silicon layer is partially oxidized inwardly from the surface of the amorphous silicon layer to form the insulating film, while the unoxidized portion of the amorphous silicon layer is used as a conductive layer. The amorphous silicon layer may contain boron or boron and an element of Group IV, for example germanium. The insulating film is utilized to fabricate a bipolar transistor.

11 Claims, 15 Drawing Figures

METHOD OF MANUFACTURING INSULATING FILM AND ELECTRIC DEVICE UTILIZING THE SAME

BACKGROUND OF THE INVENTION

This invention relates to a method of manufacturing an insulating film and a semiconductor device and other electric devices utilizing the same.

An insulating film, typically a silicon oxide film, is indispensable in the manufacture of semiconductor devices and elements for providing such isolations as an interelement isolation, interlayer isolation, interelectrode isolation, etc.

Typically silicon oxide films which have been used include a silicon dioxide film ($SiO_2$) obtained by thermally oxidizing single crystalline silicon or polycrystalline silicon, a silicon oxide film formed by oxidizing silane ($SiH_4$) that is deposited by so-called chemical vapor deposition (CVD) method and a silicon oxide film deposited on a substrate by sputtering quartz.

Thermal oxidation of single crystalline silicon usually needs a temperature higher than 1000° C. Though the oxidation rate of polycrystalline silicon is higher than that of single crystalline silicon, it is only 2 to 3 times so that even when the oxidation temperature is lowered to 900° C., a long time of about 100 minutes is necessary for forming an oxide film of 0.3 micron thickness with the wet oxidation method. Accordingly, in the manufacture of a semiconductor device due consideration is necessary for a combination of manufacturing steps before and after the step of forming the oxide film. For example, to form a bipolar transistor on a semiconductor substrate, it is usual to successively dope various impurities to form at least two semiconductor regions necessary for providing a transistor performance, and to form a silicon oxide film after forming one or the both of these regions. Consequently, when the substrate is maintained at a high temperature for a long time as mentioned above for the purpose of forming the silicon oxide film, the impurities in the semiconductor regions in the substrate would diffuse to affect the characteristics of the transistor. In addition, a high temperature heat treatment over a long time induces lattice defects thereby degrading the performance of the electric elements or devices. Where the silicon oxide comprises a polycrystalline silicon oxide, its upper surface becomes rough which decreases the breakdown voltage.

Although oxide films can be formed at a lower temperature with the CVD method and sputtering these films tend to contain pin holes which leads to a low breakdown voltage, the etching speed when they are subjected to wet etching is higher than that of thermal silicon oxide. Additionally, the sputtered oxide film will be contaminated by heavy metals.

SUMMARY OF THE INVENTION

Accordingly, it is an object of this invention to provide a method of manufacturing an insulating film having a desired thickness at a temperature lower than the conventional method.

Another object of this invention is to provide a method of manufacturing a uniform insulating film of high quality.

Still another object of this invention is to provide semiconductor devices having insulating films formed by the improved method.

To accomplish these and further objects according to this invention amorphous silicon containing boron is used.

At the 42nd (Autumn) Meeting of the Japan Society of Applied Physics, we have reported in a paper entitled "Highly conductive Ternary Amorphous Alloy Si-Ge-B" that an electroconductor having a low resistance can be formed by using amorphous silicon containing boron.

As a result of our later investigation of the oxidation charactertistic of the blank, we have found that the resulting oxide film is excellent in various points as will be described later.

According to this invention there is provided a method of manufacturing an insulating film comprising the steps of preparing a blank on which an insulating film is to be formed, forming a layer of amorphous silicon containing boron on the blank, and oxidizing the amorphous silicon layer to obtain the insulating film.

According to a preferred embodiment of this invention there is provided a method of manufacturing a transistor comprising the steps of preparing a silicon substrate, forming a collector region of the transistor; forming an oxide film by oxidizing one surface of the substrate; forming a first window through the oxide film to expose a portion of the surface; implanting an impurity of the other conductivity type into the exposed portion; heat treating the substrate to form a silicon island region which has a conductivity type different from that of the collector region, and is used as a base region of the transistor; forming an amorphous silicon layer containing boron on the silicon island region and on the oxide film; etching off a portion of the boron doped amorphous silicon layer to form a second window smaller than the first window; oxidizing remaining portion of the amorphous silicon layer to form a silicon oxide film, a portion of the amorphous silicon layer not oxidized being used as a base electrode of the transistor and a wiring layer; forming a polycrystalline silicon layer containing impurities which provide the same conductivity type as that of the collector region on the exposed portion of the substrate, the polycrystalline silicon layer being utilized as a source of impurities for forming the emitter region of the transistor as well as a wiring layer, heat treating the polycrystalline silicon layer for diffusing impurities into the base island region; forming conductive wiring layers, thus completing the transistor.

According to this invention boron can be incorporated into the amorphous silicon layer together with an element of group IV, for example germanium.

The insulating film of this invention can be used to fabricate also MOS FET transistors, SIT transistors and capacitors.

DESCRIPTION OF THE PREFERRED EMBODIMENT

A method of manufacturing a bipolar transistor having an insulating film formed by the method of this invention will now be described with reference to FIGS. 1A through 1J.

Figure 1A:
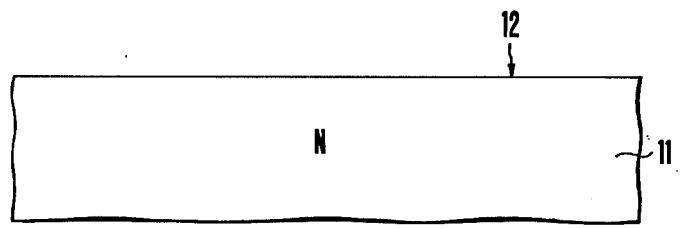
FIGS. 1A through 1J are sectional views showing successive steps of manufacturing a bipolar transistor having an insulating film manufactured according to the method of this invention.

According to this invention the steps preceding the step shown in FIG. 1A are the same as those of the conventional method. Thus, according to the conventional method an n+ buried layer is formed in a P type silicon substrate for the purpose of decreasing collector resistance, then an n type epitaxially grown layer having a specific resistance or resistivity $\rho$ of about 1 ohm.cm is formed and then an n+ collector contact diffused layer reaching the n+ buried layer is formed from the surface of the n type epitaxially grown layer. In FIG. 1A, the collector contact, and the lower region (n+ buried layer and the p type substrate) of the silicon substrate are not shown. The substrate 11 becomes the collector region of a transistor comprising an n epitaxially grown layer.

Figure 1B:
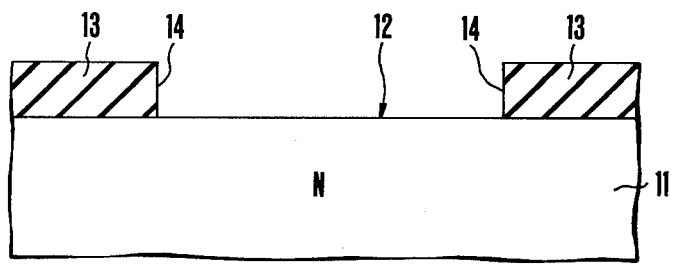
Figure 1C:
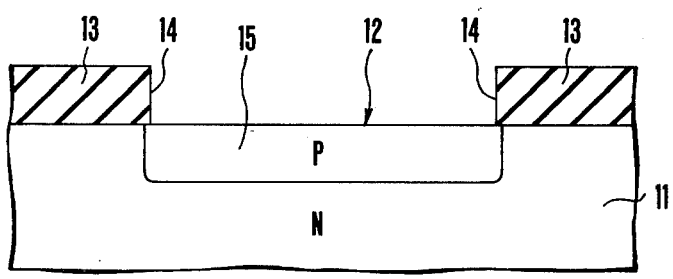

The main surface 12 of the silicon substrate 11 is subjected to wet oxidation step for 40 minutes at a temperature of 1100° C. to form an oxide film 13 having a thickness of about 4000 Å. Then, using a well known photolithography technique, a window 14 having a predetermined size is formed through the oxide film 13 to expose a portion of the main surface 12 of the substrate 11. This state is shown in FIG. 1B. Ions of boron, a p type impurity, are implanted into the substrate 11 by using the remaining portion of the oxide film 13 as a mask. An ion implantation condition is such that ions of boron are implanted at 40 KeV with a dose of $5 \times 10^{11}$ atmos/cm$^2$. The substrate is then heat treated for 30 minutes at a temperature of 900° C. so as to form a p type silicon island region 15 having a thickness of about 0.2 micron and acting as a base region as shown in FIG. 1C.

Figure 1D:
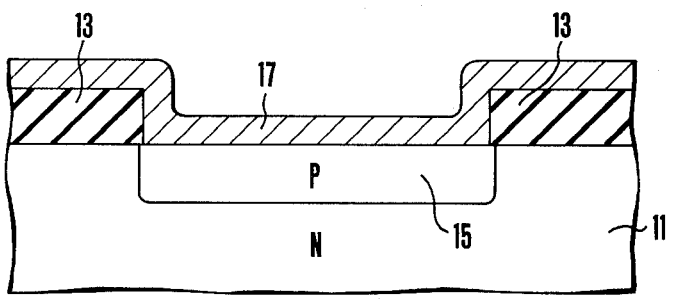

Then, as shown in FIG. 1D, an amorphous silicon layer 17 containing boron is formed on the oxide film 13 and the exposed portion of the main surface 12 of the substrate 11. This layer 17 characterizes the invention and is formed by, for example, a chemical vapor deposition method (CVD) under a vacuum of 0.2 Torr and at a temperature of 500° C. When the gas flow ratio $B_2H_6/SiH_4$ is selected to be $2 \times 10^{-2}$, amorphous silicon of about 4000 Å thickness is deposited for 200 minutes. Although the specific resistance of the amorphous silicon layer 17 varies depending upon the concentration of boron contained therein, under the conditions described above, the concentration of boron (i.e., impurity) contained in the amorphous silicon layer 17 is 36 atomic % and the specific resistance thereof is 3 ohm.cm which is sufficiently low so that the layer can be used as an electroconductor.

Figure 1E:
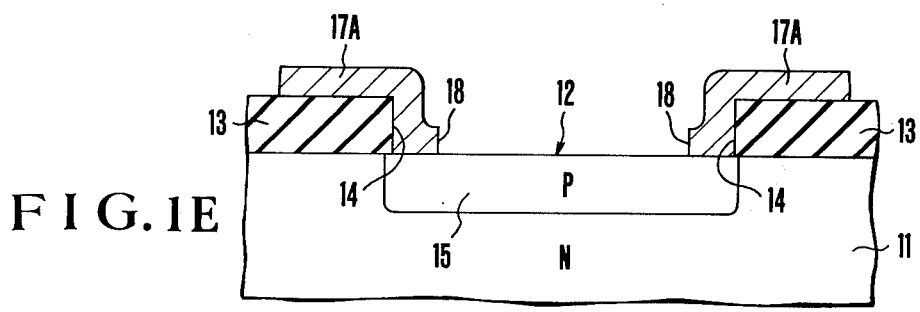
Figure 1F:
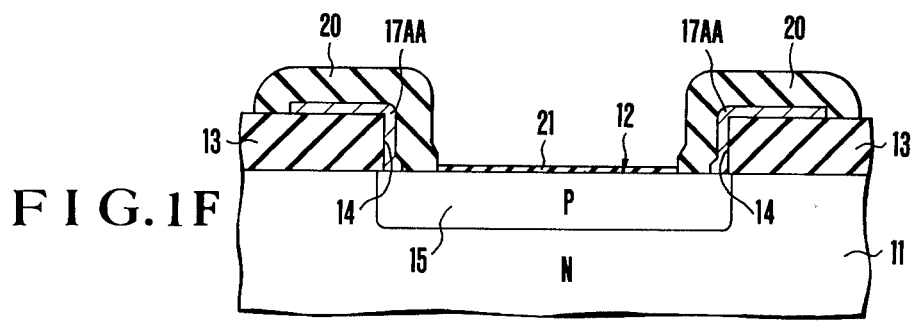

Then the amorphous silicon layer 17 is subjected to a well known photolithography process to obtain a predetermined pattern, as shown in FIG. 1E. More particularly, a portion of the layer 17 on the oxide film 13 is etched off and a window 18 having a size smaller than the window 14 is formed through the amorphous silicon layer 17 deposited on the main surface of the substrate 11. In other words, the remaining amorphous silicon layer 17A covers the side walls of the window 17, the main surface 12 contiguous thereto and the upper surface of the oxide film 13. Then the exposed surface including the remaining amorphous silicon layer 17A is wet oxidized for about 50 minutes at a temperature of 620° C. As a consequence, a surface portion of the layer 17A is oxidized so as to be converted into a silicon oxide film 20 having a thickness of about 2500 Å. At the same time, a silicon oxide film 21 having a thickness of about 40 Å is also formed on the main surface 12 of the silicon substrate 11. As will be described later in detail, the oxide film 21 formed on the silicon substrate 11 has much slower growing speed than the oxide film 20 formed on the amorphous silicon substrate 17A. Accordingly, the thickness ratio of both oxide films is about 60:1 in this example.

The initial thickness of the amorphous silicon layer 17A is about 4000 Å and only a thickness of 1000 Å from the top surface of the layer 17A is oxidized to form an oxide film having a thickness of about 2500 Å. A inner portion having a thickness of about 3000 Å of the amorphous silicon layer 17A remains as a low resistance electroconductive layer. The remaining portion is used as a base electrode and a wiring layer.

Figure 1G:
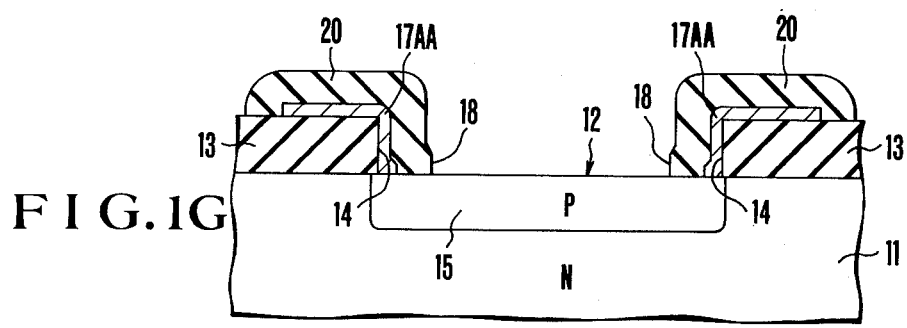

The assembly is then slightly etched for 30 to 40 seconds at a temperature of about 25° C. with an etchant consisting of a mixture of HF (50%) in aqueous solution and $H_2O$ at a volume ration of 1 to 100 for removing the oxide film 21 on the main surface 12. At this step, about 10 Å of the amorphous silicon oxide film 20 converted from the amorphous silicon layer 17 is etched off, but this thickness is negligibly small when compared with the entire thickness. The slightly etched state is shown in FIG. 1G.

Then, the polycrystalline silicon layer 25 containing such n type impurity as arsenic (As) is formed on the entire exposed surface. This doped polycrystalline silicon layer is formed by CVD method under atmospheric pressure, for example. Thus under conditions of 750° C., a partial pressure of $A_sH_3$ of $3 \times 10^{-4}$ atm. and a partial pressure of $SiH_4$ of $4.5 \times 10^{-3}$ atm. the doped polycrystalline silicon layer 25 having a thickness of about 0.3 micron can be obtained by the deposition for 6 minutes. The polycrystalline silicon layer 25 is used not only as a source of emitting the impurity for forming an emitter region (by diffusion) in the next step but also as an emitter electrode and a wiring layer. The polycrystalline silicon layer 25 is defined by well known photoetching technique. This state is shown in FIG. 1H.

Figure 1H:
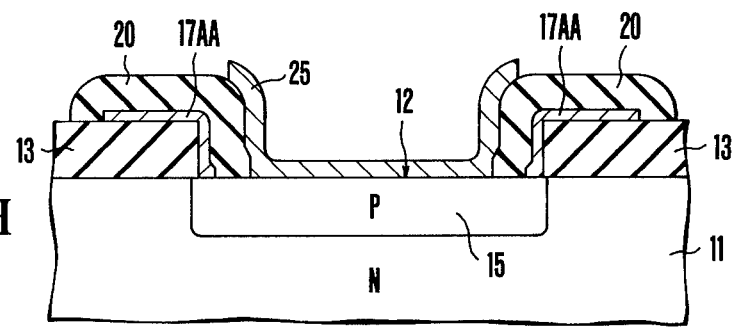
Figure 1I:
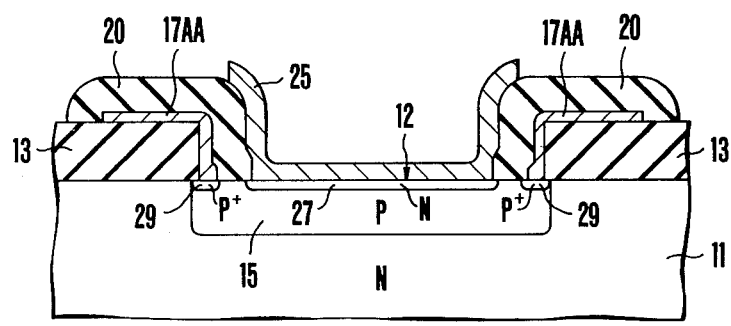

Then the assembly in the state shown in FIG. 1H is heat treated for 10 minutes at a temperature of 950° C. to diffuse arsenic into the p type island region 15 of the substrates 11 from the polycrystalline silicon layer 25 to form an n type island region having a thickness of about 0.1 micron and utilized as an emitter region. At this time, the p type impurity is diffused into the p type island region from the doped amorphous silicon conductive layer 17AA containing the p type impurity and in contact with the main surface 12, thus forming a P+ base contact 29. This state is shown in FIG. 1I.

Figure 1J:
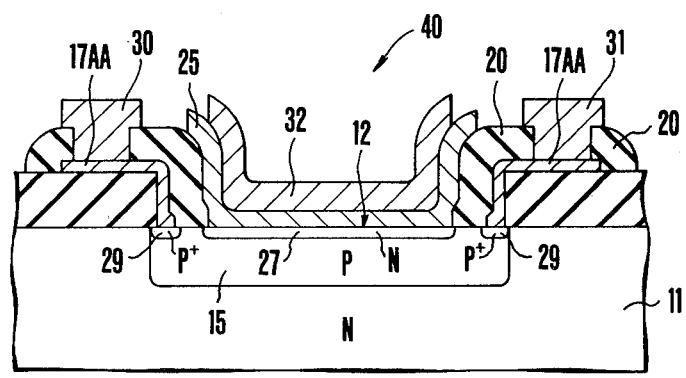

Then, by using a well known method, a conductive wiring layers 30 and 31 are formed for the conductive layer 17AA through the amorphous oxide film 20 and then a wiring layer 32 is formed on the conductive layer 25. In this manner, an npn bipolar transistor having a construction as shown in FIG. 1J is formed.

In the foregoing embodiment, instead of forming the p type silicon island region by ion implantation technique, it can be formed by any well known diffusion method. The polycrystalline silicon layer 25 can be formed by depositing amorphous silicon containing such n type impurity as As or P.

In the embodiment described above, by reversing the steps shown in FIGS. 1H and 1I for forming the n type region with ion implantation technique, the advantage of the low temperature treatment can be enjoyed. In this case, arsenic, for example, is implanted at 60 KeV to a dose of $4 \times 10^{14}$ atoms/cm$^2$, and then the assembly is heat treated for 30 minutes at a temperature of 800° C. so as to form an n type island region having a depth of about 0.1 micron. Thereafter, the n type polycrystalline silicon shown in FIG. 1H is deposited. In this case, any appreciable amount of boron does not diffuse into the substrate 11 from the amorphous conductive layer 17AA so that the base contact is not formed. Although no diffusion occurs, the characteristics of the transistor would not be impaired due to the presence of a good ohmic contact between the amorphous conductive layer and the substrate.

Furthermore, in the foregoing embodiment, boron is incorporated as an impurity into the amorphous silicon formed at the step shown in FIG. 1E, but at least one group 1V element except for silicon can be incorporated, for example germanium. Even with such element other than boron a desired bipolar transistor can be formed according to the method described above.

As above described, when the method of this application is applied to the fabrication of a bipolar transistor, the following advantages can be obtained.

Figure 2:
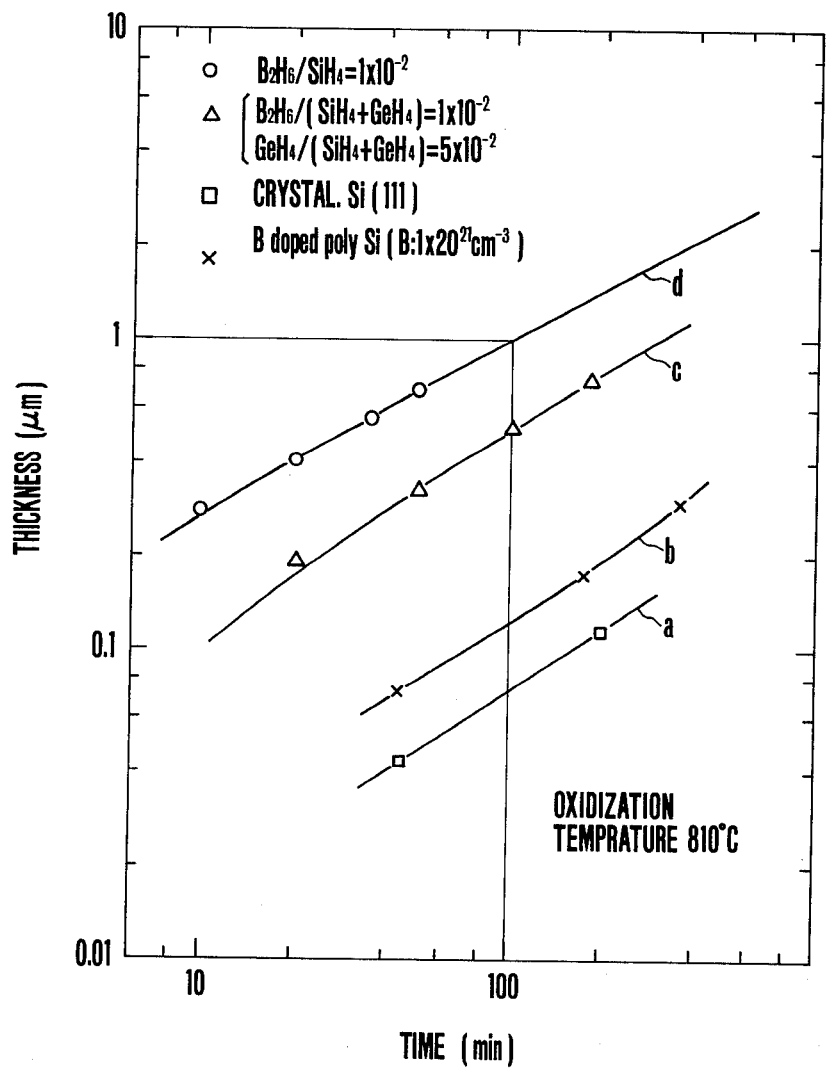
FIG. 2 is a graph showing the oxidation characteristics of amorphous silicon oxide films, a boron doped polycrystalline silicon film and (111) oriented single crystalline silicon.

Firstly, amorphous silicon containing boron has a much faster oxidation speed than single crystalline silicon or polycrystalline silicon doped with boron. This can be explained by referring to the characteristics shown in FIG. 2 in which the abscissa represents time, and the ordinate the thickness. Curve a is for single crystalline silicon having an orientation of (111), curve b for polycrystalline silicon doped with boron at a concentration of $1 \times 10^{21}$ atoms/cm$^3$, curve d for boron-doped amorphous silicon deposited with a gas flow ratio B$_2$H$_6$/SiH$_4$ of $1 \times 10^{-2}$, and curve c for boron-doped amorphous silicon deposited with gas flow ratios B$_2$H$_6$/(SiH$_4$+GeH$_4$)=$1 \times 10^{-2}$, and GeH$_4$/(SiH$_4$+GeH$_4$)=$5 \times 10^2$. The oxidation temperature of this case is 810° C.

As can be noted from these characteristic curves the amorphous silicon containing boron, characterizing the invention, provides thicker oxide films than conventional monocrystalline silicon and boron doped polycrystalline silicon at a considerably lower temperature and in a shorter time. For example, when single crystalline silicon is wet-oxidized for 100 minutes, an oxide film having a thickness of about 0.07 micron is obtained (see curve a), while in the case of boron doped polycrystalline silicon, an oxide film having a thickness of about 0.11 micron is obtained (see curve b). When the boron doped amorphous silicon is used, an oxide film having a thickness of about 1 micron can be obtained (see curve d), and with amorphous silicon doped with both boron and germanium, an oxide film having a thickness of about 0.5 micron can be obtained (see curve c).

The oxidation temperature 810° C. is substantially lower than that 1,000° C. utilized in the conventional method. At 810° C., even when the material contains impurities they will not be diffuse to an amount that effects the characteristics of the resulting transistor. It will be also apparent from FIGS. 3–5 that the oxidation temperature can be further lower. Accordingly, when a bipolar transistor is manufactured according to the method of this invention, at the time of forming an oxide film from boron doped amorphous silicon the area of the p type island region 15 is not increased to a size that changes the characteristics of the bipolar transistor.

The oxide film that can be obtained by using the boron doped amorphous silicon has an excellent quality and a uniform thickness because the material is amorphous. This substantially eliminates short circuiting between wiring layers on the opposite sides of the oxide film caused by such defect as pin holes of the oxide film. Thanks to the absence of unevenness, breakdown voltage can be higher.

The characteristics of the amorphous silicon doped with boron or boron and germanium utilized according to this invention will be considered in more detail with reference to FIGS. 3 through 6.

Figure 3:
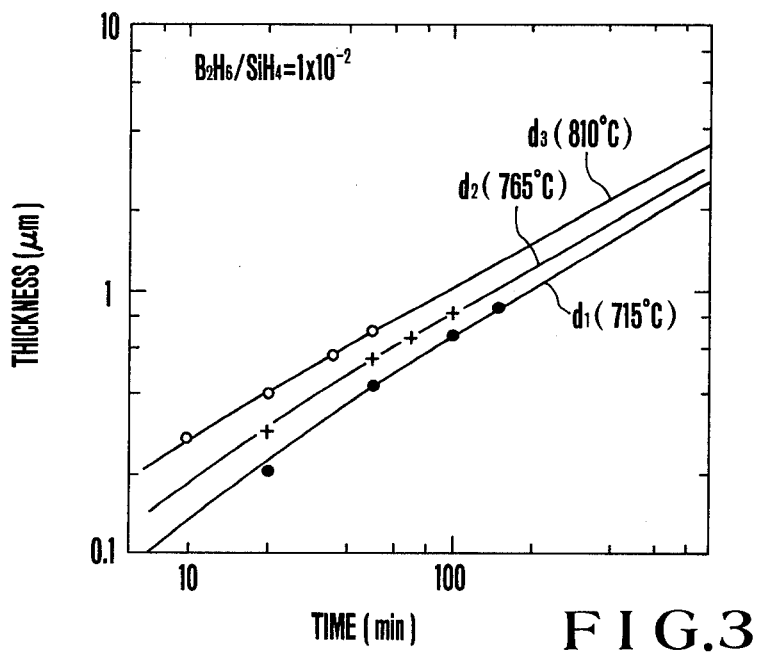
FIGS. 3, 4 and 5 are graphs showing the relation between the oxide thickness and the oxidation time of amorphous oxide films formed under various deposition conditions.
Figure 4:
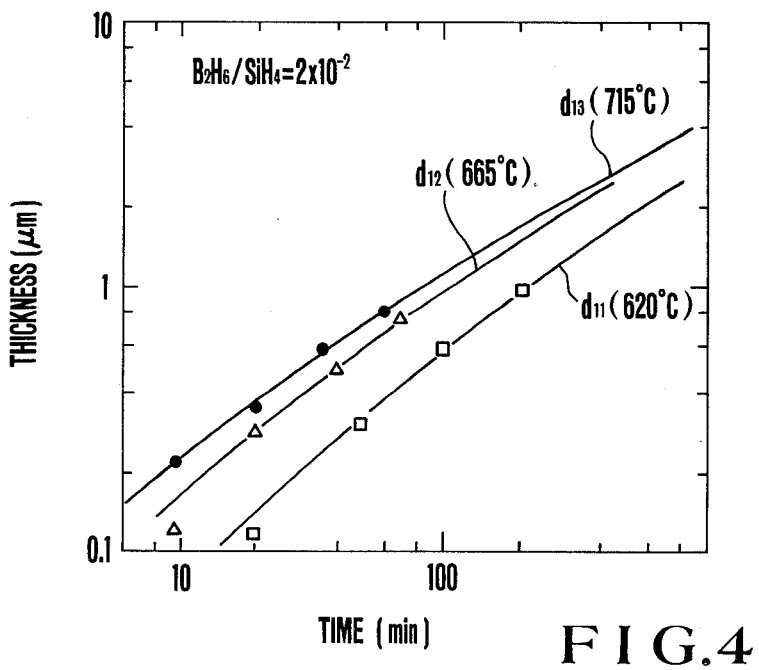
Figure 5:
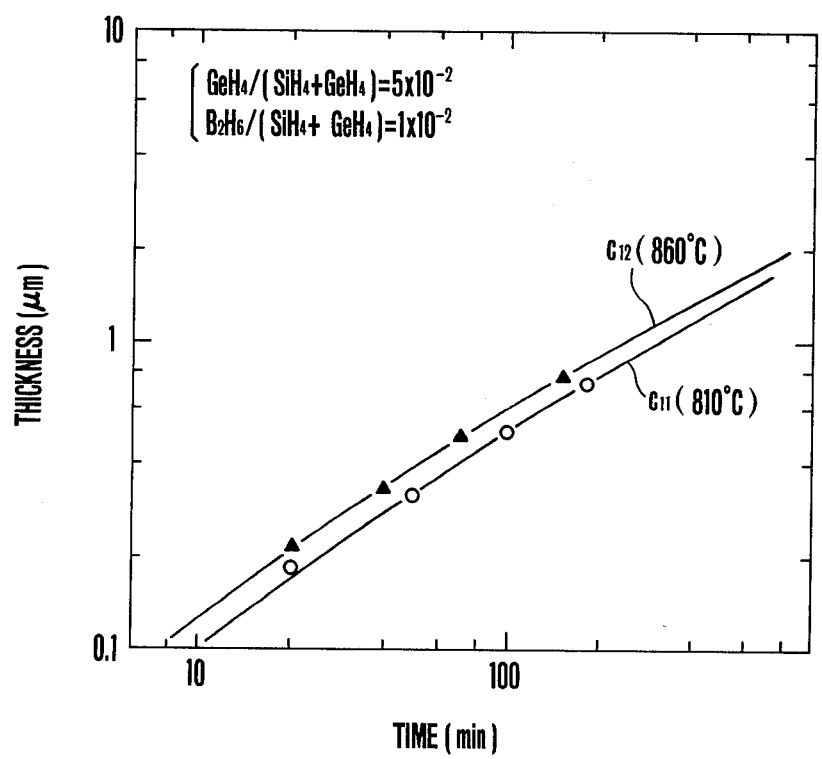

FIGS. 3, 4 and 5 show the relationship between the oxidizing time and the thickness of the oxide film of the boron doped amorphous silicons formed under various deposition conditions, taking the oxidizing temperatures as parameters. FIG. 3 shows characteristics d$_1$, d$_2$ and d$_3$ obtained by wet oxidizing amorphous silicon at 715° C., 765° C. and 810° C. respectively wherein the boron doped amorphous silicon was formed at a flow ratio of $1 \times 10^{-2}$ of the raw material gases B$_2$H$_6$ and SiH$_4$. As can be noted from these characteristic curves, at temperatures lower than 810° C. oxidation proceeds at a much faster speed than the prior art although oxidation speed slows slightly.

FIG. 13 shows characteristics d$_{11}$, d$_{12}$ and d$_{13}$ obtained by wet oxidizing amorphous silicon at 620° C., 665° C. and 715° C., respectively wherein the boron doped amorphous silicon film was obtained and, the boron doped amorphous silicon film was formed at a flow ratio twice that of FIG. 3, that is at a ratio of $2 \times 10^{-2}$ of the raw material gases B$_2$H$_6$ and SiH$_4$. These characteristic curves show that by increasing the flow ratio, the oxide film can be formed at a similar oxidizing speed even at lower temperatures than the examples shown in FIG. 3.

FIG. 5 shows characteristics C$_{11}$, C$_{12}$ obtained by oxidizing at 810° C. and 860° C. respectively amorphous silicon which was formed with different raw material gases from those of FIG. 3, that is B$_2$H$_6$, SiH$_4$ and GeH$_4$ at flow ratios of GeH$_4$/(SiH$_4$+GeH$_4$)=$5 \times 10^{-2}$ and B$_2$H$_6$/(SiH$_4$+GeH$_4$)=$1 \times 10^{-2}$.

These characteristic current also show that the oxide film can be formed at a higher oxidizing speed than that of the prior art single crystalline silicon and boron doped polycrystalline silicon in the same manner as the examples shown in FIGS. 4 and 5.

The oxide film formed of the boron doped amorphous silicon according to this invention has an etching speed four times slower than that of the prior art single crystalline silicon dioxide (SiO$_2$). For this reason, in the manufacturing of a bipolar transistor the oxide film formed of the amorphous silicon is not etched in any appreciable extent when the oxide film of single crystalline silicon is removed and then subjected to succeeding treatments, for example contact formation, and formation of an island doped with an impurity. As a consequence, the margin of the thickness of the oxide film may be small.

Figure 6:
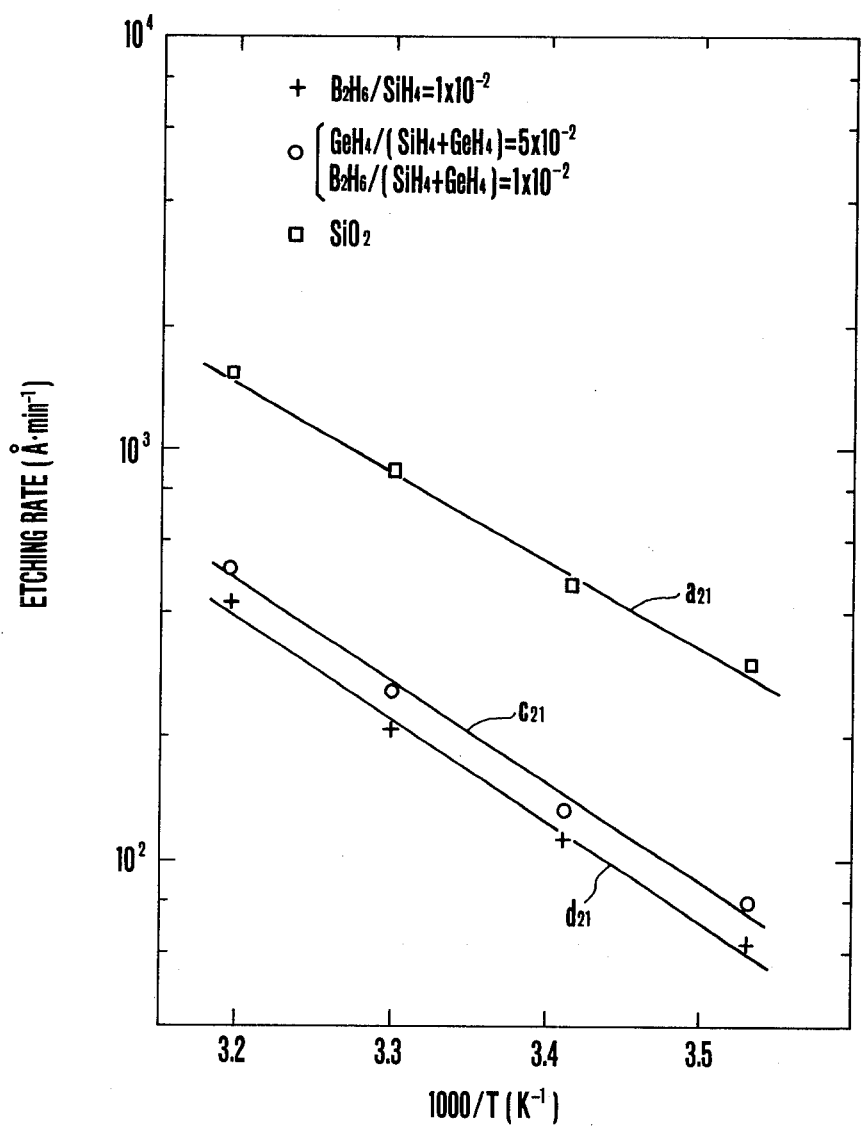
FIG. 6 is a graph showing the etching characteristics of insulating film formed by the method of this invention and a conventional silicon oxide film.

FIG. 6 shows the relationship between the etching speed and the temperature [$1,000/T(K^1)$] when an etchant consisting of a 94:9 mixture of a 40% ammonium fluoride ($NH_4F$) solution and a 50% aqueous solution of hydrogen fluoride (HF). Of these characteristics curve $d_{21}$ shows a case wherein a boron doped amorphous silicon is formed by using $B_2H_6$ and $SiH_4$ at a flow ratio of $1 \times 10^{-2}$ and then oxidized to form an oxide film. Curve $c_{21}$ shows a case wherein boron amorphous silicon is formed by using $B_2H_6$, $SiH_4$ and $GeH_4$ at flow ratios of $GeH_4/(SiH_4+GeH_4)=5 \times 10^{-2}$ and $B_2H_6/(SiH_4+GeH_4)=1 \times 10^{-2}$ and then oxidized to obtain an amorphous oxide film. Curve $a_{21}$ shows a case wherein a conventional $SiO_2$ film is formed. These characteristic curves also show that the amorphous silicon oxide film according to this invention has substantially lower etching speed than conventional silicon oxide ($SiO_2$) film.

It is confirmed that an oxide film made of an amorphous silicon film formed at a raw material flow ratio of $B_2H_6/SiH_4=2\times10^{-2}$ has substantially the same etching speed as that of the oxide film formed at a raw material flow ratio of $B_2H_6/SiH_4=1\times10^{-2}$, shown by curve $d_{21}$.

Furthermore, the oxide film made of the boron doped amorphous silicon according to this invention has a higher voltage durability than the conventional oxide film. For example, the oxide film of single crystalline silicon has a breakdown voltage of $2-9\times10^6$ V/cm and the oxide film of polycrystalline silicon has a breakdown voltage of $4.4-4.7\times10^6$ V/cm. On the other hand, an oxide film of amorphous silicon made of amorphous silicon prepared by using $B_2H_6$ and $SiH_4$ at a flow ratio of $B_2H_6/SiH_4=1\times10^2$ has a breakdown voltage of $5.3-6.7\times10^6$ V/cm. The oxide film made of amorphous silicon prepared by using $B_2H_6$, $SiH_4$ and $GeH_4$ and $GeH_4$ at raw gas flow ratios of $B_2H_6/(SiH_4+GeH_4)=2\times10^{-2}$ and $GeH_4/(SiH_4+GeH_4)=5\times10^{-2}$ has a breakdown voltage of $9.0-9.5\times10^6$ V/cm. Accordingly, the oxide film, that is the insulating film prepared by the method of this invention has more excellent insulating charcteristics.

The voltage durability tends to decrease slightly when subjected to a high temperature treatment. Yet, the amorphous silicon insulating film prepared by the method of this invention was found to have a breakdown strength of higher than $5\times10^6$ V/c after being heat treated for 30 minutes at a temperature of 1050° C.

The boron doped amorphous silicon itself has a conductivity higher than $0.1 S\cdot cm^{-1}$. Especially a ternary alloy containing silicon, boron and germanium manifests a high conductivity of $1 S\cdot cm^{-1}$ so that such alloy can be used as an electroconductor. Moreover, when subjected to oxidation process its conductivity increases by more than one order of magnitude.

For this reason, as has been described in connection with the foregoing embodiments, by controlling the thickness of the amorphous silicon layer doped with boron that should be oxidized, so as to leave a portion as a boron doped amorphous silicon layer, this portion can be used as an electrode or a wiring layer as it is. Since the amorphous silicon doped with boron or both boron and germanium has a high bonding ability to silicon single crystalline layer so that where the amorphous silicon is used as an electrode or a contact, an excellent ohmic contact can be assured that does not cause any problem due to the difference in the characteristics of the boron doped amorphous silicon and the single crystalline silicon. Further, since the doped amorphous silicon has a good adhesive property it can be used as a wiring layer just like the doped polycrystalline silicon.

It should be understood that the invention is not limited to the embodiments described above and that many changes and modifications will be obvious to one skilled in the art.

Although, in the foregoing embodiments as described with reference to FIGS. 1A–1J, the base region 15 is formed after boring a window in the silicon oxide, it may be formed either after making a window in the amorphous silicon layer containing boron and before oxidizing the amorphous silicon layer, or after forming the oxide film on the amorphous silicon layer. In such a case, it is necessary to form a base contact region contiguous to the base region. The base contact region may be formed by diffusing boron from the amorphous layer. The formation of the base contact region may be effected before or after forming the region, that is, at any time following the formation of the FIG. 1E structure and preceding the formation of the FIG. 1J structure. For example, the insulating film prepared by the method of this invention can be used not only for interelectrode isolation of a transistor but also for interelement isolation and interlayer isolation. In addition, it can be used as a dielectric for capacitors. Thus, it will be clear that the insulating film can also be applied to MOS FET transistors, SIT transistors or the like.

Although in the embodiment shown in FIGS. 1A through 1J the n type polycrystalline silicon layer 25 was used as an emitter contact layer, the layer 25 can be substituted by such metals as Mo and W which diffuse only a little into a silicon layer or by aluminum silicide. In this case, the emitter region can be formed with well known conventional methods.

What is claimed is:

1. A method of fabricating a transistor comprising the steps of:
    (a) preparing a silicon substrate of one conductivity type which functions as a collector region of the transistor;
    (b) forming on the substrate an insulating film having a first window, through which a portion of the substrate is exposed;
    (c) forming an amorphous silicon layer containing at least boron on the entire exposed surface of the substrate;
    (d) treating a portion of said amorphous silicon layer to form a second window smaller than said first window;
    (e) partially oxidizing the remaining portion of said amorphous silicon layer inwardly from its surface to form a silicon oxide film, said amorphous silicon layer not oxidized being used as a base electrode of the transistor;
    (f) forming a base region of a second conductivity type wherein said base electrode is disposed on said base region; and
    (g) forming an emitter region of the first conductivity type in the substrate and an emitter electrode disposed on said emitter region respectively after exposing a surface of the substrate within said second window.

2. The method according to claim 1, wherein said step of forming a base region of a second conductivity type is between the steps (b) and (c) for introducing an impurity of a second conductivity type with an oxidized film used as a mask.

3. The method according to claim 2, which further comprises a step of forming a base contact region contiguous to the base region by diffusing boron ions in the substrate from said remaining portion of said amorphous silicon layer.

4. The method according to claim 1 wherein said step of forming a base region of a second conductivity type is between the steps (d) and (e) for introducing an impurity of a second conductivity type with a silicon layer used as a mask.

5. The method according to claim 4, which further comprises a step of forming a base contact region contiguous to the base region by diffusing boron ions in the substrate from said remaining portion of said amorphous silicon layer.

6. The method according to claim 1, wherein said step of forming a base region of a second conductivity type between the steps (e) and (f) is for introducing an impurity of a second conductivity type with an oxidized film of silicon used as a mask.

7. The method according to claim 6, which further comprises a step of forming a base contact region contiguous to the base region by diffusing boron ions in the substrate from said remaining portion of said amorphous silicon layer.

8. A method of fabricating a transistor according to claim 1, wherein said amorphous silicon layer contains germanium.

9. A method of manufacturing an insulating film comprising the steps of:
preparing a semiconductor substrate on which an insulating film is to be formed;
forming an amorphous silicon layer containing boron and germanium on said substrate by chemical vapor deposition method using $SiH_4$, $B_2H_6$, and $GeH_4$ under low pressure;
and oxidizing said amorphous silicon layer containing boron and germanium to obtain said insulating film.

10. The method according to claim 9 wherein said amorphous silicon layer is partially oxidized inwardly from its surface so as to simultaneously form an insulating oxide layer and an electroconductive layer.

11. The method according to claim 9 wherein said silicon substrate is formed with semiconductor regions constituting a semiconductor device.

* * * * *